(12) United States Patent
Altham et al.

(10) Patent No.: US 7,525,377 B2
(45) Date of Patent: Apr. 28, 2009

(54) METHOD FOR CONTROLLING A LINEAR POWER AMPLIFIER

(75) Inventors: Andrew Altham, Southampton (GB); John Domokos, Romsey (GB)

(73) Assignee: Nokia Siemens Networks GmbH & Co. KG, Munich (DE)

( * ) Notice: Subject to any disclaimer, the term of this patent is extended or adjusted under 35 U.S.C. 154(b) by 75 days.

(21) Appl. No.: 11/661,037

(22) PCT Filed: Aug. 23, 2005

(86) PCT No.: PCT/GB2005/003278

§ 371 (c)(1),
(2), (4) Date: Feb. 26, 2007

(87) PCT Pub. No.: WO2006/021774

PCT Pub. Date: Mar. 2, 2006

(65) Prior Publication Data

US 2007/0290742 A1    Dec. 20, 2007

(30) Foreign Application Priority Data

Aug. 25, 2004   (GB) ................................ 0418944.5

(51) Int. Cl.
*H03G 3/20*   (2006.01)

(52) U.S. Cl. ........................................ 330/136; 330/10

(58) Field of Classification Search ................. 330/136, 330/297, 10
See application file for complete search history.

(56) References Cited

U.S. PATENT DOCUMENTS

| 6,043,707 | A * | 3/2000 | Budnik ........................ 330/10 |
| 6,624,712 | B1 | 9/2003 | Cygan et al. |
| 6,735,419 | B2 * | 5/2004 | Mitzlaff ................... 455/127.1 |
| 6,822,523 | B2 * | 11/2004 | Grosspietsch et al. ........ 332/149 |
| 2002/0193085 | A1 | 12/2002 | Mathe et al. |
| 2003/0025625 | A1 | 2/2003 | Mizuno et al. |

FOREIGN PATENT DOCUMENTS

DE    101 40 285 A1    2/2003

OTHER PUBLICATIONS

International Search Report for Application No. PCT/GB2005/003278; mailed Oct. 31, 2005.

* cited by examiner

*Primary Examiner*—Robert Pascal
*Assistant Examiner*—Hieu P Nguyen
(74) *Attorney, Agent, or Firm*—Staas & Halsey LLP

(57) ABSTRACT

A linear power amplifier filters an instantaneous input signal to generate a filtered input signal, combines the instantaneous input signal and filtered input signal to generate a modified drain source voltage waveform and modulates a switched mode power supply to the linear power amplifier in accordance with the modified waveform.

8 Claims, 2 Drawing Sheets

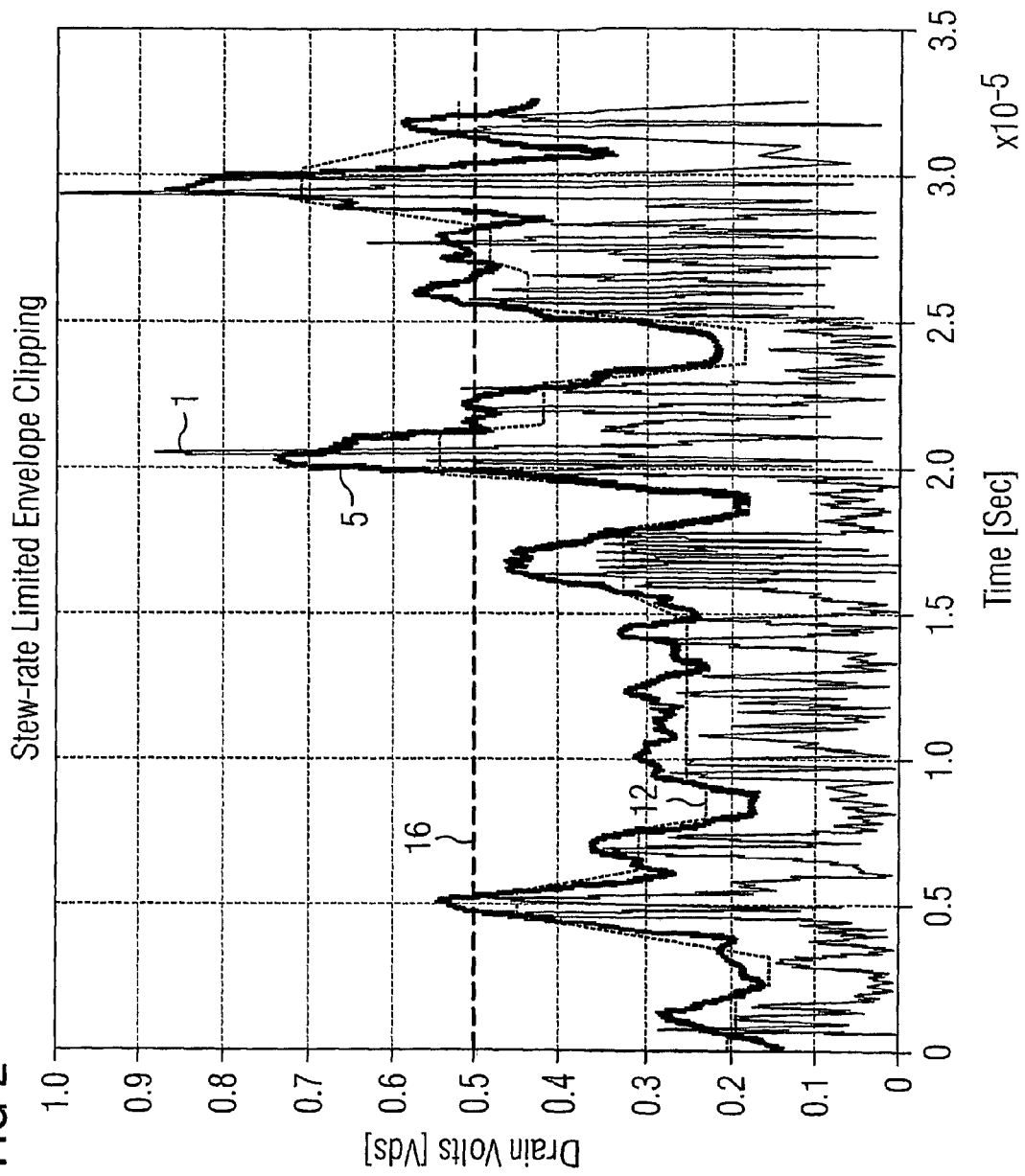

METHOD FOR CONTROLLING A LINEAR POWER AMPLIFIER

CROSS REFERENCE TO RELATED APPLICATIONS

This application is based on and hereby claims priority to United Kingdom Patent Application No. 0418944.5 filed on Aug. 25, 2004, the contents of which are hereby incorporated by reference.

BACKGROUND

Described below is a method of controlling a linear power amplifier, particularly for use in mobile communication systems.

In a base station of a mobile communication system most energy is consumed by the power amplifier, therefore to make the base station more efficient, it is desirable to provide a power amplifier which uses less power. The supply voltage of the power amplifier is converted to an RF signal, but the amount of RF required varies over time. The cooling apparatus of the power amplifier is based on the maximum RF requirement, so it is also advantageous, if this can be reduced. For optimum efficiency, the supply voltage should track the signal, but in known methods the supply voltage is fixed and the power between the supply voltage and the signal voltage is lost because there are practical problems involved in varying the supply voltage at a high rate with current to track the signal voltage.

SUMMARY

In accordance with a first aspect, a method of controlling a linear power amplifier includes inputting an instantaneous input signal; filtering the instantaneous input signal to generate a filtered input signal; combining the instantaneous input signal and filtered input signal to generate a modified drain source voltage $V_{ds}$ waveform; and modulating a switched mode power supply to the linear power amplifier in accordance with the modified $V_{ds}$ waveform.

The method generates a modified $V_{ds}$ waveform to drive the switched mode power supply with a reduced slew rate.

Preferably, the method further includes generating a clipping profile.

Preferably, the method further includes generating a modified output signal by modifying the instantaneous input signal using the clipping profile.

Preferably, the modified $V_{ds}$ waveform has a reduced slew rate with respect to that of the instantaneous input signal.

Preferably, error vector magnitude, adjacent channel power and efficiency are adapted to optimize the modified $V_{ds}$ waveform.

Preferably, the bandwidth of the modified $V_{ds}$ waveform is reduced with respect to the bandwidth of the instantaneous input signal.

Preferably, the method further includes modifying the instantaneous input signal to keep it within the modified $V_{ds}$ waveform.

In accordance with a second aspect, a linear power amplification system includes a linear power amplifier; a filter for filtering an input $V_{ds}$ waveform; a combiner to combine a filtered $V_{ds}$ waveform with the input $V_{ds}$ waveform; and a switched mode power supply to power the linear power amplifier, the power supply being modulated by the combined waveform.

Preferably, the filter is a moving average filter.

BRIEF DESCRIPTION OF THE DRAWINGS

An example of a method of controlling a linear power amplifier and a linear power amplification system will now be described with reference to the accompanying drawings in which:

FIG. 2 is a graph of drain voltage against time for a number of waveforms illustrating the method.

DETAILED DESCRIPTION OF THE PREFERRED EMBODIMENT

Figure 1:
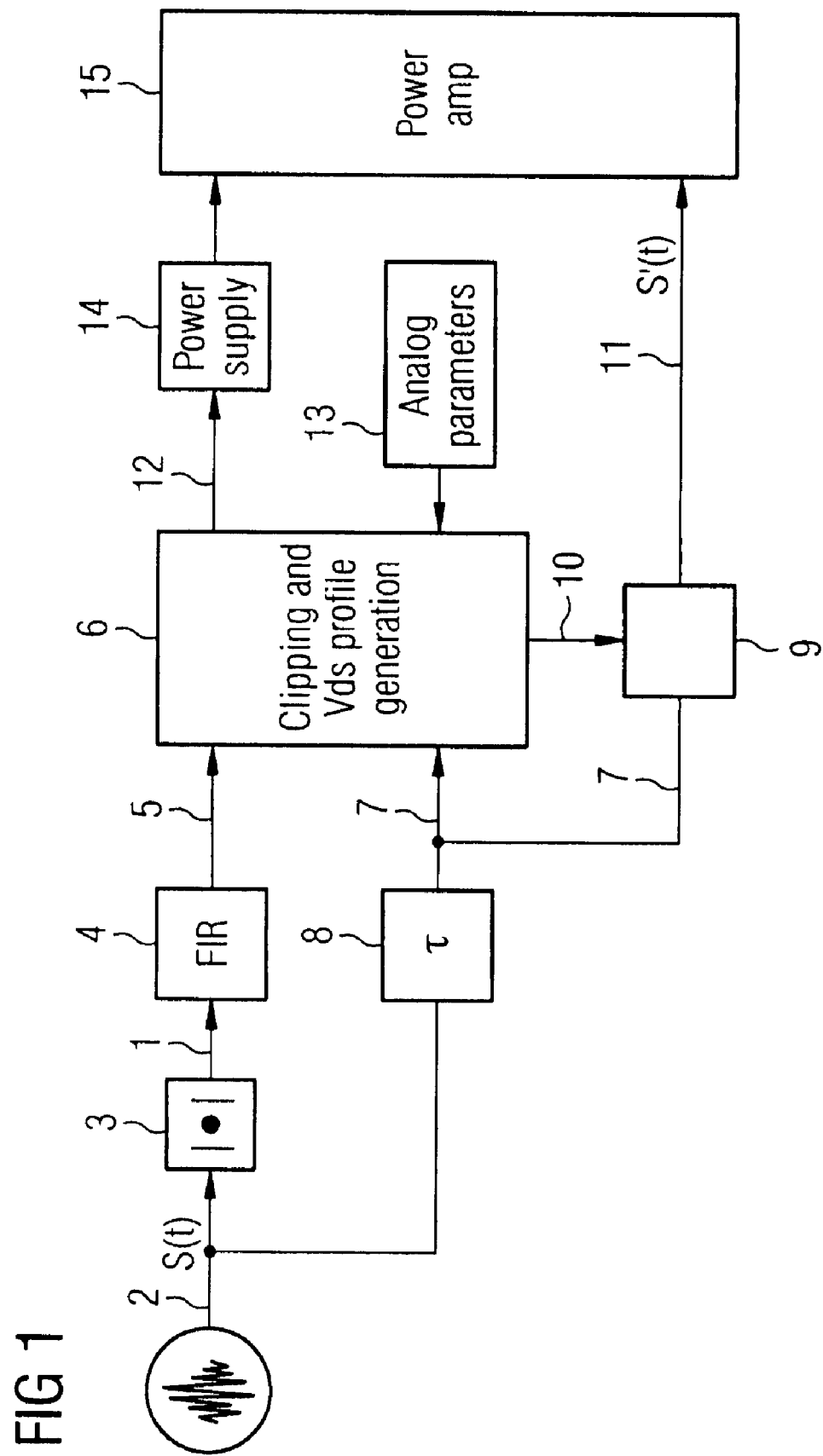
FIG. 1 is a block diagram of the system of the present invention.

Reference will now be made in detail to the preferred embodiments, examples of which are illustrated in the accompanying drawings, wherein like reference numerals refer to like elements throughout.

The method is particularly applicable for clipping a wideband code division multiple access (WCDMA) envelope dynamically, to enhance the efficiency of the linear power amplifiers in WCDMA base stations.

Single and multi-carrier WCDMA signals in $3^{rd}$ generation base stations have typically 13 to 14 dB peak to mean (p/m) ratios. The amplification of these signals is very inefficient, because the power amplifier is dimensioned for maximum power, but most of the time it operates at a mean power level.

Currently WCDMA signals are clipped in the baseband to reduce the peak to mean ratio. Typically, the signal is clipped to a p/m ratio of 8 to 9 dB. This improves the efficiency of the amplifier because it can now operate at a smaller back-off point.

Clipping to a lower p/m ratio would further increase the efficiency. However, this would cause unacceptable error vector magnitude (EVM) and also unacceptable spectral spread. The present base station power amplifiers therefore typically operate at 9 dB p/m ratios and achieve an efficiency of 10% to 20%.

Power dissipation of class AB linear amplifiers for a given signal level is directly proportional to the drain voltage (Vds). Several methods have been proposed which are based on modulating Vds proportionally to the signal envelope to improve efficiency. For example, an envelope elimination and restoration (EER) method is based on hard-clipping the envelope and then re-modulating it to a carrier at the output of the power amplifier. In an envelope tracking (ET) method, Vds tracks the signal envelope, so that the amplifier does not dissipate unnecessarily high power at low signal levels.

However, none of these methods have been implemented successfully. The voltage envelope of the WCDMA signal varies rapidly; even in the case of a single carrier, 200 to 300 nS transition times occur regularly. To modulate a switched mode power supply at such a high rate is impractical unless very high clock frequencies are used. However, at high clock rates the switched mode power supply is inefficient.

A second problem of the drain modulation is the spectral spread. This is caused by an amplitude to amplitude modulation characteristic (AM/AM) and amplitude to phase modulation (AM/PM) distortion in the power amplifier, which converts the Vds spectra into sidebands around the carrier frequency. As the drain voltage (Vds) is varied by the power supply, the amplitude and the phase of the output signal also varies to some extent. This is caused by the parasitic capacitance (Cdg—drain to gate) within the device. If the rate of Vds change is fast as is the case with normal, rather than slew rate limited drain modulation, then the sidebands extend far away from the carrier which may cause interference to the adjacent channels. This may be improved by pre-distortion in the baseband; however it is very difficult to reduce it to an acceptable level. In this method, the Vds change is slow and the parasitic sidebands are therefore close to the carrier and do not extend to the next channel. The Vds/AM and Vds/PM characteristics are improved.

FIG. 1 is a block diagram illustrating generation of signals to control a power amplifier using a baseband implementation of slew-rate limited envelope clipping. An envelope waveform 1 of a source signal S(t) 2 is derived by passing the source signal 2 through an envelope detector 3. The envelope waveform 1 is filtered by a finite impulse response filter (FIR) 4 to give a filtered envelope signal 5 which is input into a clipping and drain source voltage (Vds) profile generation circuit 6. A delayed version 7 of the source signal 2 provides a second input to the profile generation circuit 6, having been delayed by its passage through a delay element 8. The delayed source signal 7 is also tapped off and combined in block 9 with a clipping profile from the profile generation circuit 6 to produce a modified source signal S'(t) 11. Generation of the clipping profile 10 and a Vds profile 12 is also influenced by analogue parameters 13 input to the profile generation circuit 6.

The $V_{ds}$ profile signal 12 is based on a bandwidth-limited version of the envelope 1 of the source signal, s(t) 2, to be transmitted. The magnitude of the original signal S(t) 2 is filtered with the FIR filter 4 having suitable coefficients for maximally flat time domain response. The FIR filter 4 reduces the bandwidth of the envelope signal to a degree suitable for driving a switch-mode power supply 14 for modulating the drain voltage of a power amplifier 15. The original signal 2 is synchronised with the filtered waveform and the clipping profile 10 and Vds profile 12 are generated. The delay element 8 compensates for the delay through the FIR filter 4. The clipping and $V_{ds}$ profile generation circuit 6 has two purposes. Firstly, to condition the filtered envelope to make it suitable for driving the switch mode power supply 14 with a limited dynamic range. This produces the $V_{ds}$ profile output 12. Secondly, to calculate the clipping signal profile 10 based on the $V_{ds}$ profile signal 12, which can be used to remove any peaks in source signal, s(t) 2, which may cause the power amplifier 15 to be overdriven due to an inadequate drain voltage. The two outputs derived are the $V_{ds}$ profile signal 12 to be used to drive the switch-mode power supply 14 that modulates the drain voltage of the power amplifier 15; and the modified source signal s'(t) 11, which drives the input to the power amplifier for the transmitter.

The method overcomes the problems of the related art by dynamically clipping the source signal 2 so that the modified voltage envelope has a reduced slew rate. With reference to FIG. 2, the voltage envelope 1 of a single carrier waveform is shown. The maximum rise/fall time of this waveform is approximately 200 nS. It is clear that tracking such a waveform is not possible with a switched mode power supply. The line 16 at a level of 0.5 illustrates a constant clipping level that is typically implemented in known base stations. The area enclosed by the clipping line and the envelope waveform 1 is proportional to the power which is unnecessarily dissipated.

For the purpose of this example, the voltage envelope 1 is filtered by a 20 tap moving average filter 4 to generate a profile, filtered envelope 5, which has typically 2 to 3 µS rise/fall time. Based on the instantaneous envelope waveform 1 and the filtered envelope waveform 5, a Vds profile 12 is generated which then modulates the power supply 14 of the power amplifier 15. The Vds profile 12 is optimized for best EVM, adjacent channel power (ACP) and efficiency trade-off and also taking into account the analogue properties of the modulator.

A dynamic clipping technique of the method provides moderate clipping at several levels throughout the waveform. By contrast, the related art method of fixed clipping, only acts on peaks and clipping is much harder at these points. Whenever a peak of high power is clipped, there is more energy which is spread, causing interference. According to the method, it is possible to choose that high powers are only modestly clipped, but that more clipping is done at low powers. Consequently less energy is spread and better peak EVM is achieved with the dynamic clipping technique.

The slew rate limited envelope clipping is implemented in the base band, and therefore the RF devices do not need to be heavily compressed. This means that the AM/PM conversion of the RF device has less effect on the RF carrier.

Because of the slew-rate limitation of Vds, the switched mode power supply can now operate at a lower rate and hence better efficiency is achieved in the DC/DC converter of the power amplifier 15. Furthermore, due to the reduced bandwidth of the Vds profile 12, the AM/PM sidebands of the RF device are not likely to spill over to an adjacent channel.

The method is able to the drain source voltage and reduces the bandwidth of the variation to recover some efficiency. There are distortions where the power exceeds what is permitted. There are standards which dictate the maximum permitted distortion for the base station and it is common practice for the manufacturers to fix the maximum power to satisfy the distortion limits of the standards. However, the distortion budget can be reallocated by using specific algorithms to get a desired shape.

The input signal dictates the high peaks, so the algorithms control these to reduce fluctuation with minimum slew rate. A new signal is then created with an optimized result. This waveform is produced by clipping in a varying manner, with compromises around signal peaks. A second process of modifying the signal, so that it does not exceed the clipping envelope is also applied.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide* v. *DIRECTV*, (Fed. Cir. 2004).

The invention claimed is:

1. A method of controlling a radio frequency linear power amplifier, comprising:
   inputting an instantaneous input signal;
   filtering the instantaneous input signal to generate a filtered input signal;
   combining the instantaneous input signal and filtered input signal to generate a modified drain source voltage waveform and a modified instantaneous input signal;
   modulating a switched mode power supply to the radio frequency linear power amplifier in accordance with the modified drain source voltage waveform;
   driving the input of the radio frequency linear power amplifier with the modified instantaneous input signal; and
   generating a clipping profile.

2. A method according to claim 1, further comprising generating a modified output signal by multiplying the instantaneous input signal with the clipping profile.

3. A method according to claim 2, wherein the modified drain source voltage waveform has a reduced slew rate relative to the instantaneous input signal.

4. A method according to claim 3, wherein error vector magnitude, adjacent channel power and efficiency are adapted to optimize the modified waveform.

5. A method according to claim 4, wherein the bandwidth of the modified drain source voltage waveform is reduced with respect to the bandwidth of the instantaneous input signal.

6. A method according to claim 5, further comprising modifying the instantaneous input signal to keep within the modified drain source voltage waveform.

7. A linear power amplification system, comprising:
a radio frequency linear power amplifier;
a filter filtering an input waveform to produce a filtered waveform;
a combiner combining the filtered waveform with the input waveform to generate a modified drain source voltage waveform and a modified instantaneous input signal; and
a switched mode power supply powering said radio frequency linear power amplifier and modulated with the modified drain source voltage waveform, said radio frequency linear power amplifier receiving as an input the modified instantaneous input signal.

8. A system according to claim 7, wherein said filter is a moving average filter.

* * * * *